US012807474B2

(12) United States Patent
Grimes et al.

(10) Patent No.: US 12,807,474 B2
(45) Date of Patent: Nov. 24, 2026

(54) ANTI-STICTION LAYER DEPOSITION

(71) Applicant: SPTS Technologies Limited, Newport (GB)

(72) Inventors: Michael Grimes, San Jose, CA (US); Yuyuan Lin, San Jose, CA (US)

(73) Assignee: SPTS Technologies Limited, Newport (GB)

( * ) Notice: Subject to any disclaimer, the term of this patent is extended or adjusted under 35 U.S.C. 154(b) by 323 days.

(21) Appl. No.: 18/387,697

(22) Filed: Nov. 7, 2023

(65) Prior Publication Data

US 2025/0145448 A1 May 8, 2025

(51) Int. Cl.

| | |
|---|---|
| ***B81B 3/00*** | (2006.01) |
| ***B81C 1/00*** | (2006.01) |
| ***H10P 14/60*** | (2026.01) |

(52) U.S. Cl.

CPC ........ *B81B 3/0005* (2013.01); *B81C 1/00984* (2013.01); *B81C 2201/112* (2013.01); *H10P 14/6328* (2026.01); *H10P 14/6682* (2026.01); *H10P 14/6686* (2026.01)

(58) Field of Classification Search

CPC ............... B81B 3/0005; H10P 14/6682; H10P 14/6686; H10P 14/6687; H10P 14/6922

See application file for complete search history.

(56) References Cited

U.S. PATENT DOCUMENTS

| | | | |
|---|---|---|---|
| 7,045,170 | B1 | 5/2006 | Hankins et al. |
| 7,553,547 | B2 * | 6/2009 | Fryxell ................ B01J 20/3225 428/447 |
| 8,293,658 | B2 | 10/2012 | Shero et al. |
| 9,139,425 | B2 | 9/2015 | Vestyck |
| 10,112,822 | B2 | 10/2018 | Chang et al. |
| 10,900,123 | B2 | 1/2021 | Kobrin et al. |
| 2002/0064663 | A1 | 5/2002 | Murphy et al. |
| 2005/0012975 | A1 | 1/2005 | George et al. |
| 2011/0198736 | A1 | 8/2011 | Shero et al. |
| 2013/0312663 | A1 | 11/2013 | Khosla et al. |
| 2017/0342553 | A1 * | 11/2017 | Yu .......................... B01D 53/76 |
| 2018/0201496 | A1 * | 7/2018 | Huang .................. B81B 3/0005 |
| 2023/0140812 | A1 * | 5/2023 | Chiappe .............. C23C 16/0272 438/790 |

OTHER PUBLICATIONS

Choi et al., "Phase Separation of a Mixed Self-Assembled Monolayer Prepared via a Stepwise Method," Langmuir, The ACS Journal of Surfaces and Colloids, May 23, 2006, pp. 4885-4889, vol. 22, No. 11.

(Continued)

*Primary Examiner* — Wael M Fahmy
*Assistant Examiner* — Quinton A Brasfield
(74) *Attorney, Agent, or Firm* — Hodgson Russ LLP

(57) ABSTRACT

An anti-stiction layer is formed from a first organosilane precursor. A second organosilane precursor is introduced around the workpiece with the anti-stiction layer. The second organosilane precursor is different from the first organosilane precursor. The second organosilane precursor is configured to eliminate defect sites and unreacted sites on the anti-stiction layer and on a surface of the workpiece that includes the anti-stiction layer.

18 Claims, 3 Drawing Sheets

(56) References Cited

OTHER PUBLICATIONS

Feng et al., "Construction of the homogeneously mixed SAM composed of octyltriethoxysilane and octadecyltrichlorosilane by taking advantage of the molecular steric restriction," Colloids and Surfaces A: Physicochemical and Engineering Aspects, 2008, pp. 194-201, vol. 316.

Wikipedia, "Polydimethylsiloxane," Wikipedia, https://en.wikipedia.org/wiki/Polydimethylsiloxane.

EPO, Extended European Search Report issued in European Patent Application No. 24179116.9, Dec. 5, 2024.

* cited by examiner

ANTI-STICTION LAYER DEPOSITION

FIELD OF THE DISCLOSURE

This disclosure relates to films used in semiconductor manufacturing and, more particularly, to endcap films used in semiconductor devices.

BACKGROUND OF THE DISCLOSURE

Both integrated circuit (IC) device fabrication and micro-electromechanical systems (MEMS) fabrication make use of layers or coatings of material that are deposited on a workpiece. In some instances, the layers are deposited on a workpiece and then are subsequently removed, such as when the layer is used as a patterned masking material and then is subsequently removed after the pattern is transferred to an underlying layer. In other instances, the layers are deposited to perform a function in a device or system and remain as part of the fabricated device. There are numerous methods for depositing a thin film layer or a coating. In applications where the wear on the coating is likely to occur due to mechanical contact or fluid flow over the substrate surface on which the layer of coating is present, it is helpful to have the coating chemically bonded directly to the substrate surface via reaction of the species with the surface in order to obtain particular surface properties.

With respect to layers and coatings that are chemically bonded to the workpiece surface, an area of current interest is a combination of integrated circuitry with a mechanical system, which is referred to as a micro-electromechanical system (MEMS). Due to the nanometer size scale of some of the electrical devices formed, and the use of MEMS in applications such as the biological sciences, where the type and properties of the coating on the substrate surface is used to provide a particular functionality to the surface, a need has grown for improved methods of controlling the formation of the coating or layer on the substrate surface. Historically, these types of coatings were deposited in the liquid phase, resulting in limited film property control and loss of device yield due to capillary forces. More recently, vapor-phase deposition has been used as a way to replace liquid processing and to improve coating properties.

There is a particular interest in anti-stiction layers and coatings which are needed to enable reliable, long-term performance of the MEMS. Stiction (adhesion) of compliant micromechanical parts is one of the key reliability issues that has proven difficult to overcome. Conventionally, solution-based anti-stiction monolayers have been used. However, more recently, due to capillary stiction, particulate problems, and unsatisfactory quality, scalability, and reproducibility of the films produced by relatively lengthy wet processing, efforts are underway to develop vapor deposition methods for the anti-stiction coatings. The vacuum processing and vapor phase deposition of anti-stiction coatings, including self-assembled monolayers (SAMs) has provided higher quality films in general. An integrated vapor deposition process (including surface plasma treatment in the same chamber) typically offers better control of surface reactivity, while avoiding the potential for stiction between micromechanical parts during application of the anti-stiction coating.

Molecular vapor deposition (MVD) is a process technology that deposits ultra-thin films by vapor deposition at low temperatures on a broad spectrum of workpieces, such as semiconductor wafers or MEMS. The process can grow ultra-thin, functionalized, organic and inorganic films with higher yields and better cost efficiencies than traditional liquid deposition techniques. Such films can serve as lubricant, protective, hydrophobic, hydrophilic, biocompatible, or reactive coatings. In MEMS applications, for example, MVD films are typically used as anti-stiction coatings to improve device performance, and enhance overall device lifetime.

A previous approach for forming anti-stiction coatings on silicon wafers is dosing precursor organosilane molecules individually or co-dosing the organosilane precursors with water. In the latter case, the water facilitates the adsorption and polymerization of the organosilane molecules. The anti-stiction coatings formed are usually SAM films.

Some anti-stiction coatings can grow in multiple modes. Some polymerizations resulting in polydimethylsiloxane-like (PDMS-like) polymers are created and are terminated with hydroxyl groups. These hydroxyl groups are detrimental to certain applications such as anti-stiction because they decrease the hydrophobicity of the coating and leave OH groups exposed, which can contribute to stiction. Current anti-stiction films currently in use are perfluorodecyltrichlorosilane (FDTS) and fluoroctatrichlorosilane (FOTS) coatings. However, these thin films contain fluorine, which is undesirable due to environmental concerns.

Therefore, improved techniques are needed to improve anti-stiction coatings.

BRIEF SUMMARY OF THE DISCLOSURE

A method of deposition is provided in a first embodiment. A first layer is deposited on a workpiece. The first layer is formed from a first organosilane precursor and can be an anti-stiction layer. A second organosilane precursor is introduced around the workpiece with the first layer. The second organosilane precursor is different from the first organosilane precursor. The second organosilane precursor is configured to eliminate defect sites and unreacted sites on the first layer and on a surface of the workpiece that includes the first layer.

The first layer can be deposited using vapor deposition.

The method can include depositing the second organosilane precursor on the first layer using vapor deposition.

The first organosilane precursor may be dimethyldichlorosilane or dimethyldiethoxysilane. In an instance, the second organosilane precursor is N,N-dimethyltrimethylsilylamine or trimethylchlorosilane.

The first layer may be a self-assembled monolayer.

The workpiece may be silicon or aluminum oxide.

The defect sites can be hydroxyl groups.

The method can include performing a purging process that uses an inert gas between depositing the first layer and introducing the second organosilane precursor.

The second organosilane precursor may have at least the same chain length as the first organosilane precursor.

A device is provided in a second embodiment. The device includes a workpiece, a first layer disposed on the workpiece, and a second layer disposed on the first layer. The first layer is formed from a first organosilane precursor and can be an anti-stiction layer. The second layer is formed from a second organosilane precursor. The second organosilane precursor is different from the first organosilane precursor. The second organosilane precursor is configured to eliminate defect sites and unreacted sites on the first layer and on a surface of the workpiece that includes the first layer.

The workpiece may be silicon or aluminum oxide.

The first organosilane precursor may be dimethyldichlorosilane or dimethyldiethoxysilane. In an instance, the second organosilane precursor is N,N-dimethyltrimethylsilylamine or trimethylchlorosilane.

The first layer may be a self-assembled monolayer.

The second organosilane precursor may have at least the same chain length as the first organosilane precursor.

The defect sites can be hydroxyl groups.

The workpiece can be part of a MEMS device.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Embodiments disclosed herein can improve anti-stiction properties of SAMs or other anti-stiction coatings by eliminating defect sites. A first layer is deposited on a workpiece in the embodiments disclosed herein. The first layer likely contains defect sites, such as hydroxyl groups. A second layer is then deposited, which can eliminate defect sites and on the first layer. The second precursor is then introduced to preferentially react with and remove the defect sites. Thus, the defects in the thin layer formed by the first precursor are repaired. Two different organosilane molecules can be used to form an improved anti-stiction coating.

Figure 1:
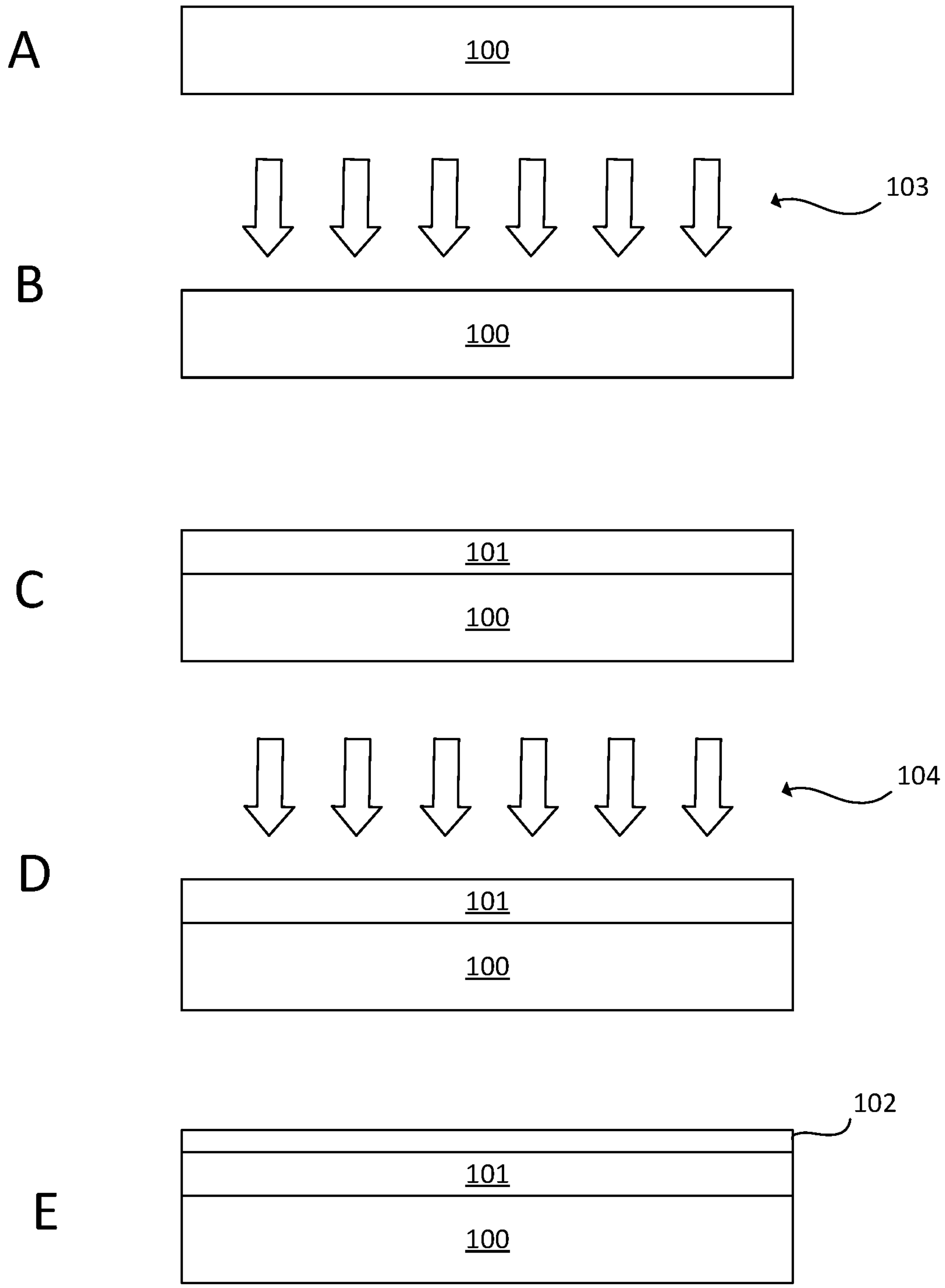
FIG. 1 illustrates a method in accordance with the present disclosure with a series of cross-section diagrams.

FIG. 1 illustrates a method with a series of cross-section diagrams. A workpiece 100 is presented at Step A. The workpiece 100 can be a semiconductor wafer or a MEMS device. For example, the workpiece 100 can be silicon or aluminum oxide.

A first layer 101 is deposited on the workpiece 100 at Step B. The deposition occurs using MVD, another vapor deposition technique, a liquid chemical process, or another deposition technique. A first organosilane precursor 103 is used during the deposition. The first organosilane precursor 103 can be introduced around the workpiece 100 with water. Deposition of the first layer can occur at a temperature from 20° C. to 150° C. In an instance, the first organosilane precursor 103 dosage may be from 0.5 to 2 Torr and the water dosage may be from 0.5 to 4 Torr.

In an example, the first organosilane precursor 103 and water vapor are kept in the MVD chamber from approximately 1-60 minutes. For example, a period of approximately 15 minutes may be used. For better film quality, multiple reaction cycles with the first organosilane precursor 103 may be needed. In an example, from 1-10 reaction cycles are performed.

MVD is a gas-phase reaction between surface reactive chemicals and an appropriately receptive surface, such as that of the workpiece 100. Bi-functional silanes in which one termination of the molecule is reactive can be used. The advantage of a gas phase reaction over a comparable liquid phase process is the control of moisture from the ambient environment, which often results in cross-polymerization of the silane, which leads to particulates on the treated surface. Often a heated sub-atmospheric vacuum chamber is used to allow precise control of the reactants and water content. Additionally the gas phase process allows for treatment of complex parts because the coverage of the reactant is generally diffusion-limited. MEMS sensors can be used to address stiction and other parasitic issues relative to surface-to-surface interactions. An example of a system for MVD is shown in U.S. Publication No. 2013/0312663, which is incorporated by reference in its entirety.

Step C shows the workpiece 100 with the resulting first layer 101 formed from the first organosilane precursor 103. The first layer 101 can be a monolayer or a multilayer. In an instance, the first layer 101 is a self-assembled monolayer. In an instance, the first layer 101 can be an anti-stiction layer. There may be defects on the first layer 101, which can include hydroxyl groups. There may be fewer than 13 defects/$nm^2$ based on the crystal structure of $SiO_2$. Other numbers or frequencies of defects are possible.

While specifically disclosed with respect to hydroxyl groups, other defects can be formed and addressed using the embodiments disclosed herein. For example, the defects can be chlorine, which can be sealed by an amine group such that the reaction byproduct is HCl. Aldehyde can react with amine with $H_2O$ as a byproduct. Other OH and NH groups can form defects and can react with the techniques disclosed herein.

The thickness of the resulting first layer 101 can be from approximately 0.2 nm to 10 nm for a silicon workpiece and from approximately 0.2 nm to 100 nm for an aluminum workpiece. In an instance, thickness of the resulting first layer 101 is approximately 1 nm.

A second organosilane precursor 104 is introduced around the workpiece 100 with the first layer 101 in Step D. The second organosilane 104 may be deposited with or without other species. The second organosilane 104 may be the only species necessary to eliminate defect sites. The second organosilane precursor 104 is different from the first organosilane precursor 103. For example, the second organosilane precursor 104 may be deposited onto the workpiece 100 using MVD. Temperature during the deposition of the second organosilane precursor 104 may be from 20° C. to 150° C. Pressure during deposition of the second organosilane precursor 104 may be from 0.1 Torr to 5 Torr.

In an example, the second organosilane precursor 104 is injected into the MVD chamber to be deposited on the first layer 100. The reaction time may be approximately 30 seconds to 2 hours. For example, the reaction time may be approximately 15 minutes. The unreacted second organosilane precursor 104 can be pumped out at the end of Step D.

In Step E, a second layer 102 formed from the second organosilane precursor 104 is formed on the first layer 101. The second organosilane precursor 104 is configured to eliminate defect sites on the first layer 101. The second organosilane precursor 104 is different from the first organosilane precursor 103. The second organosilane precursor 104 repairs the original structure of the first layer 101 by reacting with the hydroxyl groups. The silane functional group in the second organosilane precursor 104 can react with the hydroxyl group in the first layer 101 to form an Si—O bond on the surface of the first layer 101 and release dimethylamine, which can then pumped out of the chamber. This improves the anti-stiction properties of the resulting device because the defect sites are eliminated.

Besides eliminating defect sites on the first layer 101, defect sites on a surface of the workpiece 100 also can be eliminated. This can be the same surface of the workpiece 100 that includes the first layer 101. For example, part of the workpiece 100 may be exposed after the first layer 101 is formed.

The precursor for the first layer 101 is generally small, but this precursor can polymerize to form a longer chain. With a molecule length that is the same as the first organosilane precursor 103 or shorter than the first organosilane precursor 103, the second organosilane precursor 104 can penetrate the first layer 101 to some degree. However, the second organosilane precursor 104 also can be the same length or longer than the first organosilane precursor 103. The length or reactivity of the second organosilane precursor 104 can be selected such that it can react with remaining OH groups, unreacted sites, or defect sites.

While illustrated as a flat layer in FIG. 1 for simplicity, the second organosilane 104 selectively adsorbs on the points which are defects of the first layer 101. If there is no defect on the first layer 101, then there is no formation of the second layer 102. Total defects after the second organosilane precursor 104 is added may be <<13 per $nm^2$.

The second layer 102 can be created from a monofunctional precursor. As a monofunctional compound, the second organosilane precursor 104 tends to not introduce any additional defect sites. In contrast, difunctional or trifunctional chemicals can create additional OH groups during the film formation reaction. The monofunctional compounds may scavenge and react with any existing defect sites, which can eliminate them.

Reactivity, dose amount, and size of the second organosilane precursor 104 molecule can be configured to optimize elimination of defects. The functional group may be directly related to the chemical reactivity. Aminosilane functional groups are generally more reactive than chlorosilane and alkoxysilane functional groups. Higher temperature and larger doses also may increase the reactivity due to thermodynamics. A small size of second organosilane precursor 104 molecule means that the molecule can penetrate the voids and vacancies of the first layer 101, which is a geometric effect.

In an instance, the first organosilane precursor 103 is dimethyldichlorosilane (DDMS) or dimethyldiethoxysilane. Other examples of the first organosilane precursor 103 can include other vapor-deposited polymers such as bis(N,N-dimethylamino)dimethylsilane, dimethyldimethoxysilane, diethoxydimethylsilane, or 1,3-Dichloro-1,1,3,3-tetramethyldisiloxane. Mixtures of these precursors also are possible. The first organosilane precursor 103 also can be organosilane monomers that have two reactive functional groups that enable polymerization to form a polymer chain.

In an instance, the second organosilane precursor 104 is N,N-dimethyltrimethylsilylamine (TMSDMA) or trimethylchlorosilane (TMCS). Other organosilanes can be used as the second organosilane precursor 104, such as N,N-diethyltrimethylsilylamine (TMSDEA), methoxytrimethylsilane (TMSOMe), ethoxytrimethylsilane (TMSOEt), trimethylsilyl trifluoromethanesulfonate (TMSOTf), or trimethylsilylfluorosulfonate (TMSOFs). Mixtures of these precursors also are possible. The second organosilane precursor 104 may be selected to avoid certain reaction byproducts, such as HCl or dimethylamine. In an instance, the second organosilane precursor 104 can be a monofunctional silane.

In an instance, the second organosilane precursor 104 may have at least the same chain length as the first organosilane precursor 103.

In an instance, a purging process occurs between introduction of the first organosilane precursor 103 and introduction of the second organosilane precursor 104 or between cycles that introduce the first organosilane precursor 103. The purging process can use an inert gas, such as $N_2$ or Ar. This purges unreacted precursor gases and reaction byproducts.

The resulting device includes the workpiece 100, the first layer 101, and the second layer 102. The first layer 101 can be an anti-stiction layer. The second layer 102 can eliminate defect sites (e.g., hydroxyl groups) on the first layer 101. The first layer 101 and the second layer 102 can be an anti-stiction film.

In an embodiment, the method of FIG. 1 can be used for MEMS anti-stiction films. The layers formed using the method of FIG. 1 may be beneficial because these layers do not contain fluorine. Fluorine-containing materials are generally undesirable for environmental reasons.

Figure 2:
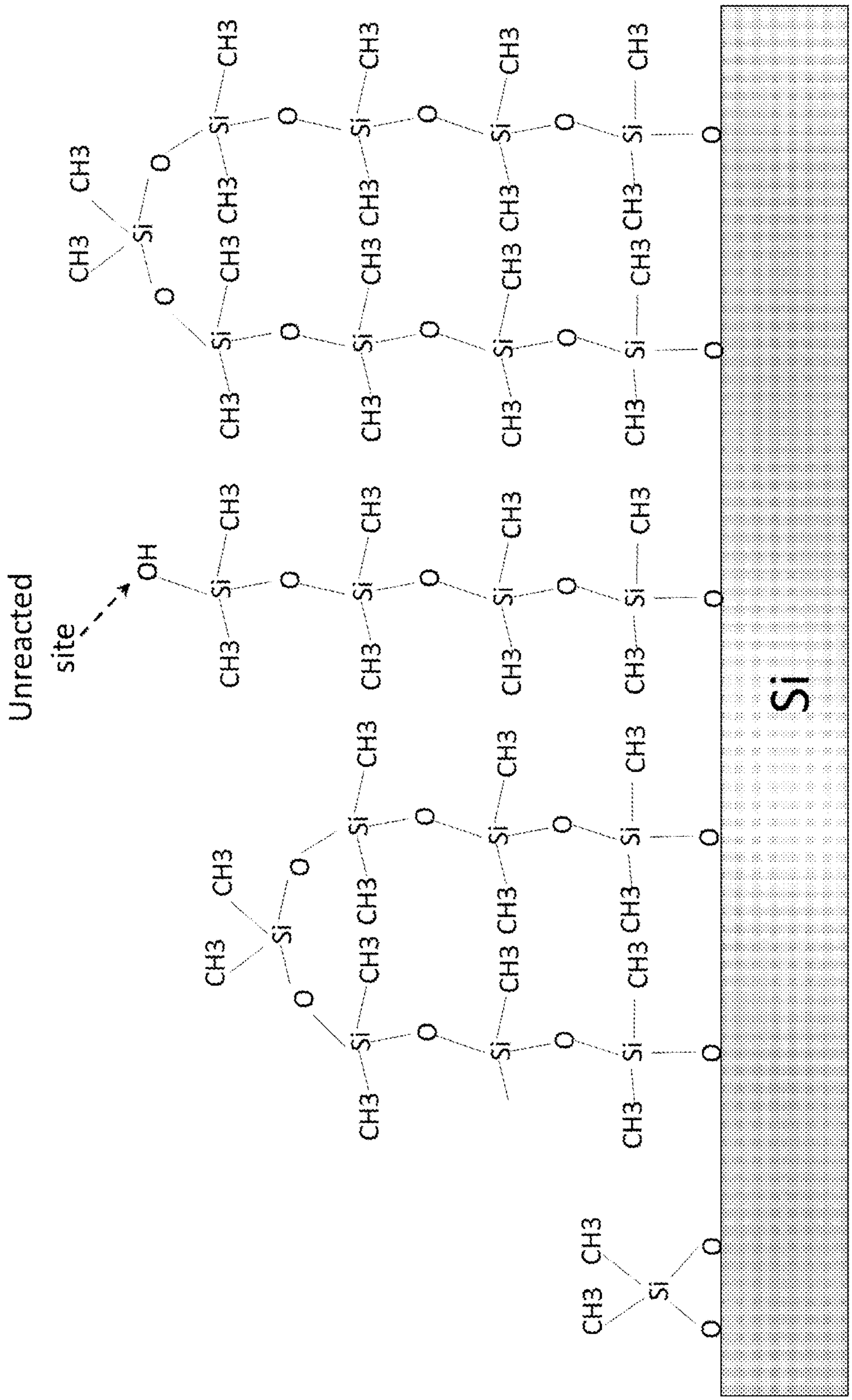
FIG. 2 shows a PDMS-like polymer with hydroxyl groups.
Figure 3:
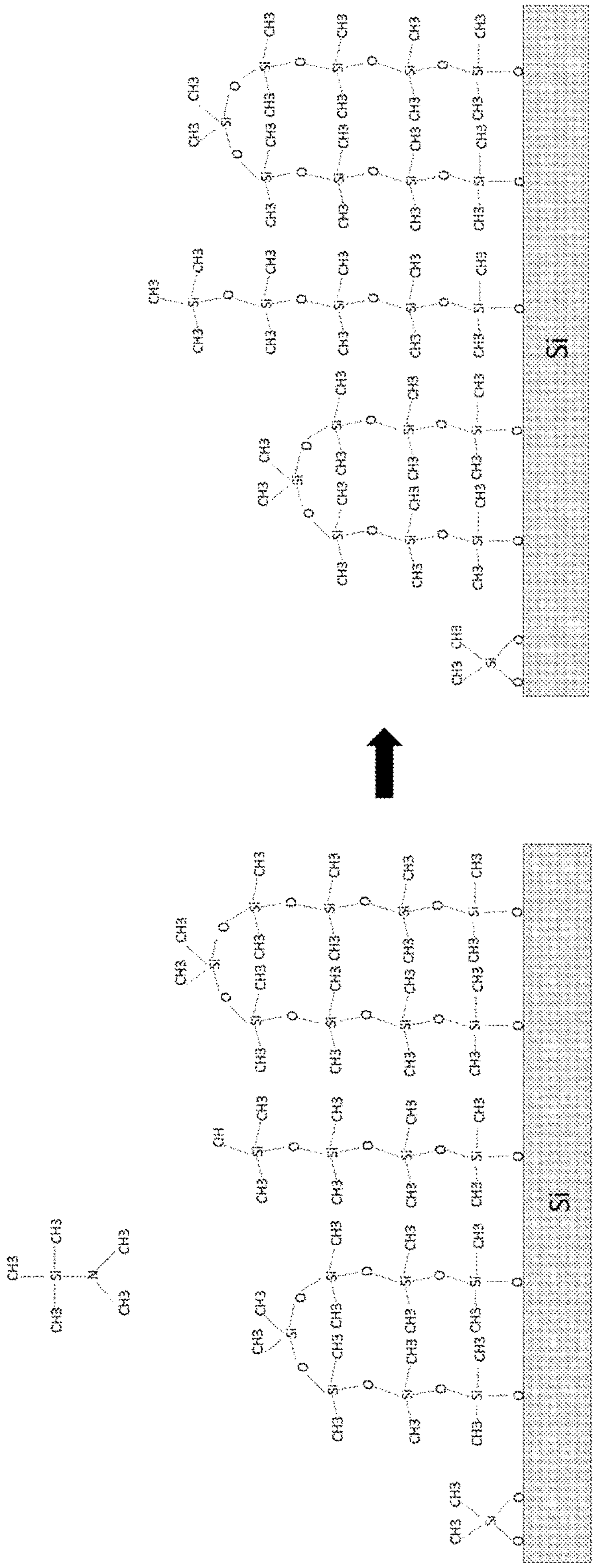
FIG. 3 shows use of a different organosilane molecule to eliminate the hydroxyl groups.

This method is further explained with respect to FIGS. 2-3. FIG. 2 shows a PDMS-like polymer with hydroxyl groups. FIG. 3 shows use of a different organosilane molecule to eliminate the hydroxyl groups. The hydroxyl group in FIG. 2 is an unreacted site. As shown in FIG. 3, the organosilane molecule reacts with the hydroxyl group and eliminates the defect.

An unreacted site is any chemical group that the organosilane precursor can react with. Most unreacted sites for anti-stiction applications are OH groups. For example, unreacted sites may be any remaining OH groups on the surface. This can be an OH group that was originally present on the surface that still exists because it did not react with the first organosilane precursor.

A defect site, such as an OH group, can be formed during the reaction of the first organosilane precursor. A defect site is created later during application of the first layer and is not initially present on the sample surface.

Stiction was measured by atomic force microscope (AFM) in an experiment. An end-capped DDMS coating had dangling hydroxyl groups that need to be passivated. TMSDMA molecules can react with the hydroxyl groups and passivate the DDMS film. A silicon AFM tip was placed in contact with the MVD-coated surfaces to simulate stiction and measure the anti-stiction properties of the coatings.

AFM was carried out in soft tapping mode and force volume mode. 1×1 μm scans were collected with a resolution of 512×512 pixels. 16×16 point adhesion maps over a 50×50 μm area were collected. The TMSDMA end-capped DDMS coating demonstrates less adhesion force than DDMS-only coating, as shown in the table below.

| | Roughness Sa (nm) | Average Adhesion (nN) | STDev Adhesion (nN) |
|---|---|---|---|
| DDMS-coated Si | 0.126 | 45.49 | 2.29 |
| TMSDMA-capped DDMS on Si | 0.15 | 6.37 | 0.47 |

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A method of deposition comprising:

depositing a first layer on a workpiece, wherein the first layer is formed from a first organosilane precursor, wherein the first organosilane precursor is dimethyldichlorosilane or dimethyldiethoxysilane, and wherein the first layer is an anti-stiction layer;

introducing a second organosilane precursor around the workpiece with the first layer, wherein the second organosilane precursor is a monofunctional precursor that includes a silane functional group, and wherein the second organosilane precursor is different from the first organosilane precursor; and reacting a hydroxyl group of the first layer with the silane functional group of the second organosilane precursor to form an Si—O bond on a surface of the first layer, wherein the second organosilane precursor is configured to eliminate defect sites and unreacted sites on the first layer and on the surface of the workpiece that includes the first layer during the reacting.

2. The method of deposition of claim 1, wherein the first layer is deposited using vapor deposition.

3. The method of deposition of claim 1, further comprising depositing the second organosilane precursor on the first layer using vapor deposition.

4. The method of deposition of claim 1, wherein the second organosilane precursor is N,N-dimethyltrimethylsilylamine.

5. The method of deposition of claim 1, wherein the second organosilane precursor is trimethylchlorosilane.

6. The method of deposition of claim 1, wherein the first layer is a self-assembled monolayer.

7. The method of deposition of claim 1, wherein the workpiece is silicon or aluminum oxide.

8. The method of deposition of claim 1, wherein the defect sites are hydroxyl groups.

9. The method of deposition of claim 1, further comprising performing a purging process that uses an inert gas between depositing the first layer and introducing the second organosilane precursor.

10. The method of deposition of claim 1, wherein the second organosilane precursor has at least the same chain length as the first organosilane precursor.

11. A device comprising:

a workpiece;

a first layer disposed on the workpiece, wherein the first layer is formed from a first organosilane precursor, wherein the first organosilane precursor is dimethyldichlorosilane or dimethyldiethoxysilane, and wherein the first layer is an anti-stiction layer; and a second layer disposed on the first layer, wherein the second layer is formed from a second organosilane precursor that is a monofunctional precursor and includes a silane functional group, wherein the second organosilane precursor is different from the first organosilane precursor, and wherein the second organosilane precursor is configured to eliminate defect sites and unreacted sites on the first layer and on a surface of the workpiece that includes the first layer by reacting a hydroxyl group of the first layer with the silane functional group of the second organosilane precursor to form an Si—O bond on the surface of the first layer.

12. The device of claim 11, wherein the workpiece is silicon or aluminum oxide.

13. The device of claim 11, wherein the second organosilane precursor is N,N-dimethyltrimethylsilylamine.

14. The device of claim 11, wherein the second organosilane precursor is trimethylchlorosilane.

15. The device of claim 11, wherein the first layer is a self-assembled monolayer.

16. The device of claim 11, wherein the second organosilane precursor has at least the same chain length as the first organosilane precursor.

17. The device of claim 11, wherein the defect sites are hydroxyl groups.

18. The device of claim 11, wherein the workpiece is part of a MEMS device.

* * * * *